United States Patent [19]
Dorri et al.

[11] Patent Number: 5,396,207
[45] Date of Patent: Mar. 7, 1995

[54] ON-SHOULDER MRI MAGNET FOR HUMAN BRAIN IMAGING

[75] Inventors: Bizhan Dorri, Clifton Park; Evangelos T. Laskaris, Schenectady; Michele D. Ogle, Burnt Hills, all of N.Y.

[73] Assignee: General Electric Company, Schenectady, N.Y.

[21] Appl. No.: 286,363

[22] Filed: Aug. 5, 1994

[51] Int. Cl.[6] .......................... G01R 33/20; H01F 7/22
[52] U.S. Cl. ................................. 335/216; 128/653.5; 324/318; 324/319
[58] Field of Search ............... 335/216, 296, 299, 300, 335/301; 128/653.2, 653.5; 324/318, 319, 320

[56]        References Cited
         U.S. PATENT DOCUMENTS

| 4,500,860 | 2/1985  | Vermilyea       |         |
| 4,580,120 | 4/1986  | Jacquot         | 335/301 |
| 4,701,736 | 10/1987 | McDougall et al.| 335/299 |
| 4,724,412 | 2/1988  | Kalafala        |         |
| 4,924,198 | 5/1990  | Laskaris        |         |
| 4,986,078 | 1/1991  | Laskaris        |         |
| 5,307,039 | 4/1994  | Chari et al.    | 355/299 |
| 5,332,987 | 7/1994  | Hennessy et al. | 335/216 |

OTHER PUBLICATIONS

U.S. Patent Application Ser. No. 08/260,433, filed Jun. 15, 1994, by E. T. Laskaris et al., "Open MRI Magnet with Superconductive Shielding".
U.S. Patent Application Ser. No. 08/237,516, filed Apr. 29, 1994, by E. T. Laskaris et al., "Pancake MRI Magnet with Modified Imaging Volume".
U.S. Patent Application Ser. No. 08/223,200, filed Apr. 5, 1994, by E. T. Laskaris et al., "Open MRI Magnet With Uniform Magnetic Field".
2-page Sales Brochure from Houston Advanced Researach Center entitled "MRI Magnets with Unprecedented Patient Access".
Concurrently filed U.S. Patent Application Docket No. RD-23698 by Bizhan Dorri et al., entitled "Over--Shoulder MRI Magnet for Human Brain Imaging".

Primary Examiner—Leo P. Picard
Assistant Examiner—Raymond M. Barrera
Attorney, Agent, or Firm—Douglas E. Erickson; Paul R. Webb, II

[57] ABSTRACT

A magnetic resonance imaging (MRI) magnet having an annularly cylindrical-shaped vacuum enclosure with a longitudinal axis, first and second longitudinal ends, a first larger diameter bore extending from the first towards the second longitudinal end, and a second smaller diameter bore extending from the second longitudinal end to the first bore. First and second superconductive coils are placed in the vacuum enclosure with the first coil generally circumferentially surrounding the first bore and the second coil circumferentially surrounding the second bore, wherein the radial distance of the radially innermost portion of the second coil from the axis is smaller than the radius of the first bore. The second longitudinal end of the vacuum enclosure fits on a patient's shoulders with the patient's head passing through the second bore and extending into the first bore for MRI brain imaging.

11 Claims, 1 Drawing Sheet

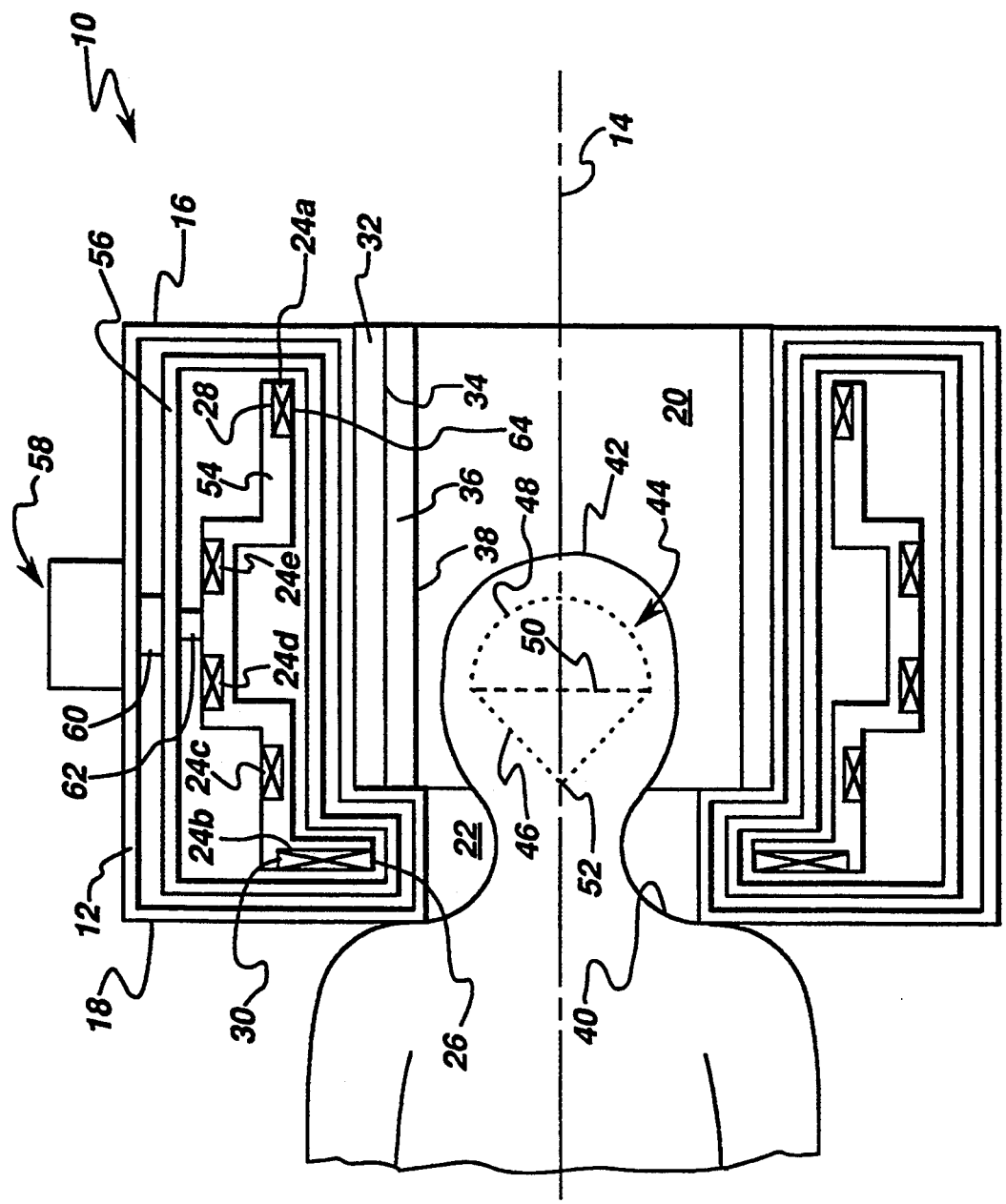

ON-SHOULDER MRI MAGNET FOR HUMAN BRAIN IMAGING

BACKGROUND OF THE INVENTION

The present invention relates generally to a superconductive magnet used to generate a high magnetic field as part of a magnetic resonance imaging (MRI) diagnostic system, and more particularly to such a magnet having a compact design for inexpensively imaging specific parts of the human body, such as the brain.

MRI systems employing superconductive magnets are used in various fields such as medical diagnostics. Known superconductive magnets include liquid-helium cooled and cryocooler-cooled superconductive magnets. Typically, for a cryocooler-cooled magnet, the superconductive coil assembly includes a superconductive main coil surrounded by a thermal shield surrounded by a vacuum enclosure. A cryocooler coldhead is externally mounted to the vacuum enclosure, has its first stage in thermal contact with the thermal shield, and has its second stage in thermal contact with the superconductive main coil.

Superconductive magnets have been mentioned in a sales brochure which claim a helmet design (with eye opening) for MRI brain imaging within a 10 centimeter-diameter spherical imaging volume of 2 Tesla having a pre-shim inhomogeneity of 10 parts per million (ppm) and a bore diameter of 20 centimeters. However, such designs have not been disclosed.

Known superconductive magnets include those having a large, tubular-shaped superconductive coil assembly with one or more longitudinally spaced-apart main coils carrying an equal electric current in a first direction for generating a high magnetic field within the spherical imaging volume of the magnet's bore. Such whole-body magnets provide an expensive way for MRI imaging of the brain.

What is needed is a relatively inexpensive superconductive magnet designed for MRI imaging of the human brain.

SUMMARY OF THE INVENTION

It is an object of the invention to provide a superconductive MRI magnet having a compact design for imaging the human brain.

The magnetic resonance imaging (MRI) magnet of the invention includes a generally annularly cylindrical-shaped vacuum enclosure, at least two superconductive coils, and a gradient coil. The vacuum enclosure has a generally longitudinally extending axis, first and second longitudinal ends, a first bore, and a second bore. The first bore is generally coaxially aligned with the axis, extends with a generally constant radius from the first longitudinal end towards the second longitudinal end, and is spaced apart from the second longitudinal end. The second bore is generally coaxially aligned with the axis and extends with a generally constant radius from the second longitudinal end to the first bore, with the radius of the second bore being smaller than the radius of the first bore. The superconductive coils are longitudinally spaced apart, generally coaxially aligned with the axis, and positioned within and spaced apart from the vacuum enclosure. The superconductive coils include a first coil and a second coil each carrying an electric current in generally the same direction. The first coil generally circumferentially surrounds the first bore, and the second coil generally circumferentially surrounds the second bore. The second coil has a radially innermost portion, with the radial distance of the radially innermost portion of the second coil from the axis being smaller than the radius of the first bore. The gradient coil is positioned within the first bore and has a radially innermost portion, with the radial distance of the radially innermost portion of the gradient coil from the axis being generally at least as large as the radius of the second bore.

In a preferred embodiment, the superconductive coils generate a magnetic resonance imaging volume having a shape of generally a cone fitted to a hemisphere along a common generally circular base which is located closer to the second longitudinal end than to the first longitudinal end of the vacuum enclosure.

Several benefits and advantages are derived from the invention. Applicants' radially inward positioning of a superconductive coil, longitudinal shifting to one side of the imaging volume, and hemisphere-cone shaping of the imaging volume provide a compact MRI magnet design for medical imaging of the human brain when the second longitudinal end of the vacuum enclosure is fitted on a patient's shoulders with the patient's head passing through the second bore and extending into the first bore.

BRIEF DESCRIPTION OF THE DRAWINGS

The accompanying drawing illustrates a preferred embodiment of the present invention wherein:

The FIGURE is a schematic cross-sectional top-planar view of the MRI magnet of the invention with hatching lines omitted for clarity.

DETAILED DESCRIPTION OF THE INVENTION

Referring now to the drawing, the FIGURE shows a preferred embodiment of the magnetic resonance imaging (MRI) magnet 10 of the present invention. The magnet 10 includes a generally annularly cylindrical-shaped vacuum enclosure 12 having a generally longitudinally extending axis 14, first and second longitudinal ends 16 and 18, a first bore 20, and a second bore 22. The first bore 20 is generally coaxially aligned with the axis 14, extends with a generally constant radius from the first longitudinal end 16 towards the second longitudinal end 18, and is spaced apart from the second longitudinal end 18. The second bore 22 is generally coaxially aligned with the axis 14 and extends with a generally constant radius from the second longitudinal end 18 to the first bore 20, with the radius of the second bore 22 being smaller than the radius of the first bore 20. In an exemplary embodiment, the longitudinal distance the first bore 20 extends from the first longitudinal end 16 is greater than the longitudinal distance separating the first bore 20 from the second longitudinal end 18, and preferably the first bore 20 extends generally proximate the second longitudinal end 18.

The magnet 10 also includes a plurality of longitudinally spaced-apart superconductive coils 24a to 24e generally coaxially aligned with the axis 14 and disposed within and spaced apart from the vacuum enclosure 12. The superconductive coils 24a to 24e, including a first coil 24a and a second coil 24b, each carry an electric current in generally the same direction (which is either a clockwise or a counterclockwise circumferential direction about the axis 14 with any slight longitudinal component of current direction being ignored).

The first coil 24a generally circumferentially surrounds the first bore 20, and the second coil 24b generally circumferentially surrounds the second bore 22. The second coil 24b has a radially innermost portion 26, wherein the radial distance of the radially innermost portion 26 of the second coil 24b from the axis 14 is smaller than the radius of the first bore 20.

In an exemplary embodiment, the first coil 24a is disposed closer to the first longitudinal end 16 than to the second longitudinal end 18, and the second coil 24b is disposed closer to the second longitudinal end 18 than to the first longitudinal end 16. Preferably, the first coil 24a is disposed generally proximate the first longitudinal end 16, and the second coil 24b is disposed generally proximate the second longitudinal end 18. In a preferred embodiment, the first and second coils 24a and 24b each extend a longitudinal length and a radial length, wherein the longitudinal length of the first coil 24a is greater than the radial length of the first coil 24a, and wherein the radial length of the second coil 24b is greater than the longitudinal length of the second coil 24b. In a favored embodiment, the first coil 24a has a radially outermost portion 28 and the second coil 24b has a radially outermost portion 30, wherein the radial distance of the radially outermost portion 30 of the second coil 24b from the axis 14 is generally equal to the radial distance of the radially outermost portion 28 of the first coil 24a from the axis 14.

The magnet 10 further includes a gradient coil 32 disposed within the first bore 20 and having a radially innermost portion 34, wherein the radial distance of the radially innermost portion 34 of the gradient coil 32 from the axis 14 is generally at least as large as the radius of the second bore 22. Preferably, the magnet 10 additionally includes a radio-frequency coil 36 disposed within the first bore 20 radially inward of the gradient coil 32. The radio-frequency coil 36 has a radially innermost portion 38, wherein the radial distance of the radially innermost portion 38 of the radio-frequency coil 36 from the axis 14 is generally at least as large as the radius of the second bore 22. It is noted that in the FIGURE, the gradient coil 32 is schematically shown as contacting the vacuum enclosure 12 and the radio-frequency coil 36 is schematically shown as contacting the gradient coil 32. However, as is known to those skilled in the art, an MRI magnet typically may also include passive shims, a gradient shield, and a gap between the vacuum enclosure 12 and the gradient coil 32, and typically may also include a radio-frequency shield and a gap between the gradient coil 32 and the radio-frequency coil 36 (such shims, shields, and gaps are not shown in the FIGURE for clarity). It is mentioned that the gradient shield may be omitted if continuous metallic paths are avoided on and within the vacuum enclosure 12 for an eddy-current-free magnet 10.

Although the magnet 10 may be used to image various parts of the human body, such as limbs, the magnet 10 preferably is designed specifically for MRI imaging of the human brain. Thus, the first and second bores 20 and 22 preferably are sized such that the second longitudinal end 18 fits on a patient's shoulders 40 with the patient's head 42 passing through the second bore 22 and extending into the first bore 20. It is noted that the term "patient" means an average-sized human adult patient with such size averaged over males and females, as can be determined by those skilled in the art. Using the principles of the present invention, previously described herein, together with conventional magnetic field analysis, as is within the skill of the artisan, the superconductive coils 24a to 24e preferably are designed to generate a magnetic resonance imaging volume 44 (shown in dotted line) in the first bore 20 in the region of the patient's brain when the second longitudinal end 18 of the vacuum enclosure 12 is fitted on (i.e., rests on) the patient's shoulders 40 with the patient's head 42 passing through the second bore 22 and extending into the first bore 20. Preferably, the superconductive coils 24a to 24e are designed to generate a magnetic resonance imaging volume 44 which is generally coaxially aligned with the axis 14 and which has a shape of generally a cone 46 fitted to a hemisphere 48, with the cone 46 and the hemisphere 48 each having a common generally circular base 50 (shown on edge as a dashed line), with the cone 46 having an apex 52 facing generally towards the second bore 22, and with the circular base 50 disposed longitudinally closer to the second longitudinal end 18 than to the first longitudinal end 16. Such hemisphere-cone imaging volume 44 more accurately matches the shape of the human brain than does a conventional spherical-shaped imaging volume, with the hemisphere 48 encompassing the primary brain region and with the cone 46 encompassing the brain stem.

Using the principles of the present invention, previously described herein, together with conventional magnetic field analysis, as is within the skill of the artisan, Applicants designed (but have yet to build) such a magnet 10 having a generally 0.5 Tesla magnetic field within a generally hemisphere-cone imaging volume 44 having a design peak-to-peak magnetic field inhomogeneity of less than 10 parts-per-million (ppm) with the hemisphere 48 having a radius of generally 7.5 centimeters, with the circular base 50 having a radius of generally 7.5 centimeters, and with the cone 46 having an altitude of generally 7.5 centimeters from the apex 52 to the circular base 50. The first bore 20 was designed to have a diameter of generally 31 centimeters, and the second bore 22 was designed to have a diameter of generally 25 centimeters. The vacuum enclosure 12 had a longitudinal length of generally 49 centimeters, an outer diameter of generally 50 centimeters, and the circular base 50 was positioned generally 22 centimeters from the second longitudinal end 18 of the vacuum enclosure 12.

In Applicants' magnet design, the superconductive coils 24a to 24e comprised a continuous (integral or spliced) length of generally 0.12-inch wide and generally 0.01-inch thick Nb—Sn superconductive tape kept at a temperature of generally 10 Kelvin and carrying an electric current having an amperage of generally 210 amperes. The first coil 24a is longitudinally located generally 2.5 centimeters from the first longitudinal end 16 of the vacuum enclosure 12, is radially located generally 17.5 centimeters from the axis 14, extends a longitudinal length of generally 4.2 centimeters, extends a radial length of generally 1.1 centimeters, and has generally 430 meters of superconductive tape. The second coil 24b is longitudinally located generally 2.0 centimeters from the second longitudinal end 18 of the vacuum enclosure 12, is radially located generally 14.0 centimeters from the axis 14, extends a longitudinal length of generally 0.9 centimeters, extends a radial length of generally 4.3 centimeters, and has generally 330 meters of superconductive tape. The third coil 24c is longitudinally located generally 9.2 centimeters from the second coil 24b, is radially located generally 17.5 centimeters from the axis 14, extends a longitudinal length of generally 1.9 centimeters, extends a radial length of generally 0.9 centimeters, and has generally 160 meters of superconductive tape. The fourth coil 24d is longitudinally located generally 5.4 centimeters from the third coil 24c, is radially located generally 21.1 centimeters from the axis 14, extends a longitudinal length of generally 3.5 centimeters, extends a radial length of generally 0.9 centimeters, and has generally 350 meters of superconductive tape. The fifth coil 24e is longitudinally located generally 6.8 centimeters from the fourth coil 24d and generally 9.3 centimeters from the first coil 24a, is radially located generally 21.1 centimeters from the axis 14, extends a longitudinal length of generally 3.6 centimeters, extends a radial length of generally 0.9 centimeters, and has generally 380 meters of superconductive tape. Preferably, the magnet 10 includes a coil form 54 supporting the superconductive coils 24a to 24e.

In an exemplary embodiment, the magnet 10 includes a thermal shield 56 disposed within and spaced apart from the vacuum enclosure 12, wherein the superconductive coils 24a to 24e are disposed within and spaced apart from the thermal shield 56. Conventional spacers (omitted from the FIGURE for clarity) space and support the coil form 54 from the thermal shield 56 and the thermal shield 56 from the vacuum enclosure 12. Preferably, the magnet 10 is provided with a cryocooler coldhead 58 (such as a cryocooler coldhead of a Gifford-McMahon cryocooler) having a first stage 60 and a second stage 62, wherein the second stage 62 (which has a temperature of generally 10 Kelvin) is colder than the first stage 60 (which has a temperature of generally 40 Kelvin). As seen from the FIGURE, the second stage 62 is in thermal contact with the superconductive coils 24a to 24e (by being in thermal contact with the coil form 54), and the first stage 60 is in thermal contact with the thermal shield 56. Preferably, the coil form 54 and the thermal shield 56 each comprise a glass reinforced epoxy composite having copper (or some other high thermal conductivity material) wires or strips, and the vacuum enclosure 12 comprises a glass reinforced epoxy composite having some vapor barrier structure (such as stainless steel foils) embedded in it.

The compact design of the on-shoulder brain imaging MRI magnet 10 of the invention achieves high magnetic field strength with low design magnetic field inhomogeneity by coil positioning and imaging volume placement and shaping. MRI brain imaging for an on-the-shoulder magnet 10 requires proper longitudinal placement of the imaging volume 44 from the second longitudinal end 18 of the vacuum enclosure 12. This is achieved, in part, by designing the superconductive coils 24a to 24e to produce an imaging volume 44 having a hemisphere-cone shape which more closely approximates the shape of the human brain and by designing the superconductive coils 24a to 24e such that the center (i.e., the circular base 50) of the imaging volume 44 is placed closer to the second longitudinal end 18 than to the first longitudinal end 16 of the vacuum enclosure 12. Also, low magnetic field inhomogeneity requires a large solid angle between the inplane of the circular base 50 of the imaging volume 44 and each of the first and second coils 24a and 24b. This is achieved, in part, by longitudinally positioning the first coil 24a proximate the first longitudinal end 16 of the vacuum enclosure 12 and the second coil 24b proximate the second longitudinal end 18 of the vacuum enclosure 12 with the radially innermost portion 26 of the second coil 24b radially positioned inward of the radially innermost portion 64 of the first coil 24a. Such design techniques result in an MRI magnet 10 whose imaging volume 44 is superimposed over, and closely matches the shape of, a patient's brain when the patient's shoulders 40 are fitted on the second longitudinal end 18 of the vacuum enclosure 12 with the patient's head 42 passing through the second bore 22 and extending into the first bore 20. It is noted that preferably the patient is in a supine position on a medical examining table (not shown in the FIGURE) which is brought to the MRI magnet 10 to have the second longitudinal end 18 of the vacuum enclosure 12 be fitted on the patient's shoulders 40. The foregoing description of a preferred embodiment of the invention has been presented for purposes of illustration. It is not intended to be exhaustive or to limit the invention to the precise forms disclosed, and obviously many modifications and variations are possible in light of the above teaching. For example, the superconductive coils 24a to 24e of the magnet 10 of the invention are not limited to being cryocooler-cooled, and may be liquid-helium (or other liquid-cryogen) cooled. It is intended that the scope of the invention be defined by the claims appended hereto.

We claim:

1. A magnetic resonance imaging magnet comprising:
   a) a generally annularly cylindrical-shaped vacuum enclosure having:
      (1) a generally longitudinally extending axis,
      (2) first and second longitudinal ends,
      (3) a first bore generally coaxially aligned with said axis, extending with a generally constant radius from said first longitudinal end towards said second longitudinal end, and spaced apart from said second longitudinal end, and
      (4) a second bore generally coaxially aligned with said axis and extending with a generally constant radius from said second longitudinal end to said first bore, wherein said radius of said second bore is smaller than said radius of said first bore;
   b) a plurality of longitudinally spaced-apart superconductive coils generally coaxially aligned with said axis and disposed within and spaced apart from said vacuum enclosure, said superconductive coils including a first coil and a second coil each carrying an electric current in generally the same direction, said first coil generally circumferentially surrounding said first bore and said second coil generally circumferentially surrounding said second bore, said second coil having a radially innermost portion, and wherein the radial distance of said radially innermost portion of said second coil from said axis is smaller than said radius of said first bore; and
   c) a gradient coil disposed within said first bore and having a radially innermost portion, wherein the radial distance of said radially innermost portion of said gradient coil from said axis is generally at least as large as said radius of said second bore.

2. The magnet of claim 1, also including a radio-frequency coil disposed within said first bore radially inward of said gradient coil and having a radially innermost portion, and wherein the radial distance of said radially innermost portion of said radio-frequency coil from said axis is generally at least as large as said radius of said second bore.

3. The magnet of claim 1, wherein said first bore extends generally proximate said second longitudinal end, said first coil is disposed generally proximate said first longitudinal end, and said second coil is disposed generally proximate said second longitudinal end.

4. The magnet of claim 3, wherein said first and second coils each extend a longitudinal length and a radial length, wherein said longitudinal length of said first coil is greater than said radial length of said first coil, and wherein said radial length of said second coil is greater than said longitudinal length of said second coil.

5. The magnet of claim 4, wherein said first coil has a radially outermost portion and said second coil has a radially outermost portion, and wherein the radial distance of said radially outermost portion of said second coil from said axis is generally equal to the radial distance of said radially outermost portion of said first coil from said axis.

6. The magnet of claim 1, wherein said first and second bores are sized such that said second longitudinal end fits on a patient's shoulders with the patient's head passing through said second bore and extending into said first bore.

7. The magnet of claim 6, wherein said superconductive coils generate a magnetic resonance imaging volume in said first bore in the region of the patient's brain when the second longitudinal end is fitted on the patient's shoulders with the patient's head passing through said second bore and extending into said first bore.

8. The magnet of claim 7, wherein said imaging volume is generally coaxially aligned with said axis and has a shape of generally a cone fitted to a hemisphere, said cone and said hemisphere each having a common generally circular base, said cone having an apex facing generally towards said second bore, and said circular base disposed longitudinally closer to said second longitudinal end than to said first longitudinal end.

9. The magnet of claim 1, also including a thermal shield disposed within and spaced apart from said vacuum enclosure, wherein said superconductive coils are disposed within and spaced apart from said thermal shield, and further including a cryocooler coldhead having a first stage and a second stage, wherein said second stage is colder than said first stage, wherein said second stage is in thermal contact with said superconductive coils, and wherein said first stage is in thermal contact with said thermal shield.

10. The magnet of claim 9, also including a coil form supporting said superconductive coils, and wherein said second stage of said cryocooler coldhead is in thermal contact with said coil form.

11. The magnet of claim 1, wherein said first bore has a diameter of generally 31 centimeters, said second bore has a diameter of generally 25 centimeters.

* * * * *